United States Patent
Shiah et al.

(10) Patent No.: US 10,037,787 B2
(45) Date of Patent: Jul. 31, 2018

(54) CIRCUIT FOR OUTPUTTING INFORMATION OF A MEMORY CIRCUIT DURING A SELF-REFRESH MODE AND RELATED METHOD THEREOF

(71) Applicant: Etron Technology, Inc., Hsinchu (TW)

(72) Inventors: Chun Shiah, Hsinchu (TW); Ho-Yin Chen, Hsinchu County (TW); Cheng-Nan Chang, Tainan (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 15/696,200

(22) Filed: Sep. 6, 2017

(65) Prior Publication Data
US 2018/0068693 A1  Mar. 8, 2018

Related U.S. Application Data

(60) Provisional application No. 62/383,610, filed on Sep. 6, 2016.

(51) Int. Cl.
*G11C 7/00* (2006.01)
*G11C 7/08* (2006.01)

(52) U.S. Cl.
CPC ....................... *G11C 7/08* (2013.01)

(58) Field of Classification Search
CPC .......................................... G11C 7/08
USPC ............................................ 365/222, 230.01
See application file for complete search history.

(56) References Cited

U.S. PATENT DOCUMENTS

| | | | | |
|---|---|---|---|---|
| 8,072,827 B2 * | 12/2011 | Wakimoto | ............ | G11C 11/406 365/200 |
| 8,848,413 B2 * | 9/2014 | Donkoh | ................ | G11C 11/418 365/191 |

FOREIGN PATENT DOCUMENTS

| | | |
|---|---|---|
| KR | 2000-0065733 A | 11/2000 |
| TW | I224337 | 11/2004 |

* cited by examiner

*Primary Examiner* — Fernando Hidalgo
(74) *Attorney, Agent, or Firm* — Winston Hsu

(57) ABSTRACT

A circuit for outputting information of a memory circuit during a self-refresh mode includes a driver. The driver is coupled to a self-refresh control circuit and a self-refresh address counter. The driver is used for driving a plurality of pads of the memory circuit to output information of a plurality of inner signals corresponding to a self-refresh mode signal, and output information of addresses of a plurality of word lines of the memory circuit when the self-refresh mode signal and a test mode signal are enabled and the memory circuit enters the self-refresh mode. Each word line of the plurality of word lines corresponds to an inner signal of the plurality of inner signals.

15 Claims, 8 Drawing Sheets

_US 10,037,787 B2_

CIRCUIT FOR OUTPUTTING INFORMATION OF A MEMORY CIRCUIT DURING A SELF-REFRESH MODE AND RELATED METHOD THEREOF

CROSS REFERENCE TO RELATED APPLICATIONS

This application claims the benefit of U.S. Provisional Application No. 62/383,610, filed on Sep. 6, 2016 and entitled "Internal Information output scheme of Self Refresh Mode," the contents of which are incorporated herein by reference

BACKGROUND OF THE INVENTION

1. Field of the Invention

The present invention relates to a circuit for outputting information of a memory circuit during a self-refresh mode and a related method thereof, and particularly to a circuit and a method thereof that can utilize a plurality of pads of the memory circuit which do not output or receive other pre-determining signals after the memory circuit enters the self-refresh mode to output information of a plurality of inner signals correspond to a self-refresh mode signal and information of addresses of a plurality of word lines of the memory circuit corresponding to the plurality of inner signals.

2. Description of the Prior Art

After a memory circuit enters a self-refresh mode, the memory circuit will automatically execute data-refresh operation on memory cells coupled to word lines corresponding to inner signals of the memory circuit in turn according to the inner signals of the memory circuit. Because the memory circuit automatically executes the data-refresh operation on the memory cells coupled to the word lines corresponding to the inner signals in turn according to the inner signals, a tester does not know whether the memory cells coupled to the word lines corresponding to the inner signals are refreshed and whether addresses of the word lines corresponding to the inner signals are correct. Therefore, the tester cannot know that the memory circuit malfunctions due to execution of the data-refresh operation or other reasons if the memory circuit malfunctions after the memory circuit leaves the self-refresh mode, resulting in the tester being not easier to exclude malfunction of the memory circuit.

SUMMARY OF THE INVENTION

An embodiment of the present invention provides a circuit for outputting information of a memory circuit during a self-refresh mode. The circuit includes a driver. The driver is coupled to a self-refresh control circuit and a self-refresh address counter of the memory circuit for driving a plurality of pads of the memory circuit to output information of a plurality of inner signals corresponding to a self-refresh mode signal, and output information of addresses of a plurality of word lines of the memory circuit when the self-refresh mode signal and a test mode signal are enabled and the memory circuit enters the self-refresh mode, wherein each word line of the plurality of word lines corresponds to an inner signal of the plurality of inner signals.

Another embodiment of the present invention provides a method for outputting information of a memory circuit during a self-refresh mode, wherein a circuit applied to the method includes a driver. The method includes enabling a self-refresh mode signal and a test mode signal; and the driver driving a plurality of pads of the memory circuit to output information of a plurality of inner signals corresponding to the self-refresh mode signal, and output information of addresses of a plurality of word lines of the memory circuit when the self-refresh mode signal and the test mode signal are enabled and the memory circuit enters the self-refresh mode, wherein each word line of the plurality of word lines corresponds to an inner signal of the plurality of inner signals.

Another embodiment of the present invention provides a memory circuit capable of outputting information thereof during a self-refresh mode. The memory circuit includes a self-refresh control circuit, a self-refresh address counter, an inner signal pad, at least one address information pad, and a driver, wherein the driver includes an inner signal driving circuit and at least one address information driving circuit. The self-refresh control circuit generates a plurality of inner signals corresponding to a self-refresh mode signal according to the self-refresh mode signal. The self-refresh address counter generates an address count according to an inner signal of the plurality of inner signals. The driver is coupled to the self-refresh control circuit, the self-refresh address counter, the inner signal pad, and the at least one address information pad. The inner signal driving circuit is coupled to the inner signal pad, and the at least one address information driving circuit is coupled to the at least one address information pad. The inner signal driving circuit outputs the inner signal to the inner signal pad, and the at least one address information driving circuit outputs the address count to the at least one address information pad.

The present invention provides a circuit for outputting information of a memory circuit during a self-refresh mode and a related method thereof. The circuit and the method utilize a driver to drive a plurality of pads of the memory circuit to output information of a plurality of inner signals corresponding to a self-refresh mode signal, and output information of addresses of a plurality of word lines of the memory circuit corresponding to the plurality of inner signals after a tester enables the self-refresh mode signal and a test mode signal, wherein the plurality of pads do not output or receive other predetermining signals after the memory circuit enters the self-refresh mode. Because the tester can obtain the information of the plurality of inner signals and the information of the addresses of the plurality of word lines corresponding to the plurality of inner signals according to outputs of the plurality of pads, if the memory circuit malfunctions after the memory circuit leaves the self-refresh mode, the tester can know that the memory circuit malfunctions due to self-refresh errors of the memory circuit or other reasons. Therefore, compared to the prior art, the tester can be easier to exclude malfunction of the memory circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
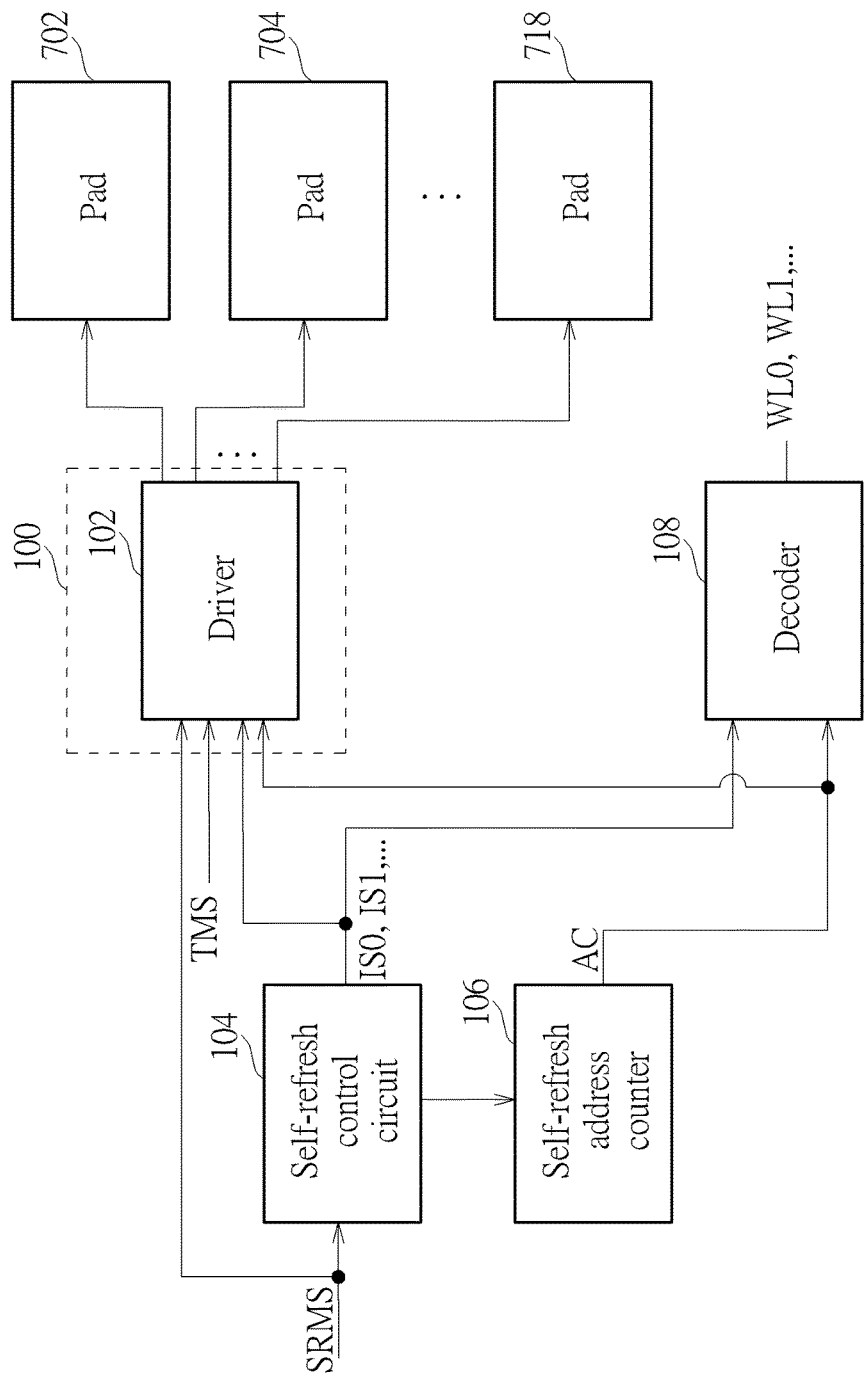
FIG. 1 is a diagram illustrating a circuit for outputting information of a memory circuit during a self-refresh mode according to a first embodiment of the present invention.

Please refer to FIG. 1. FIG. 1 is a diagram illustrating a circuit 100 for outputting information of a memory circuit during a self-refresh mode according to a first embodiment of the present invention. As shown in FIG. 1, the circuit 100 includes a driver 102, wherein the driver 102 is coupled to a self-refresh control circuit 104 and a self-refresh address counter 106 of the memory circuit, the self-refresh address counter 106 is coupled to the self-refresh control circuit 104, and a decoder 108 is coupled to the self-refresh control circuit 104 and the self-refresh address counter 106.

Figure 2:
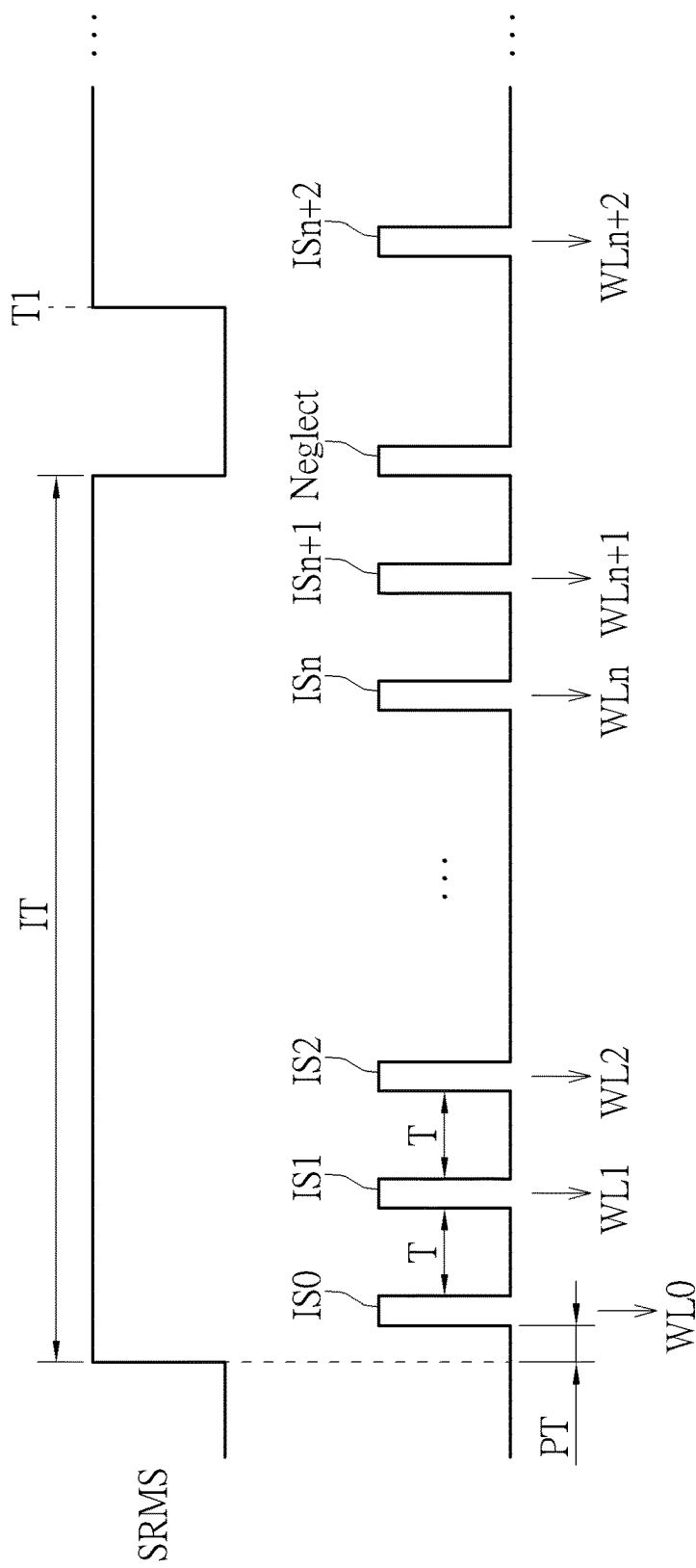
FIGS. 2, 3 are diagrams illustrating the self-refresh control circuit generating a plurality of inner signals corresponding to a self-refresh mode signal after the memory circuit enters the self-refresh mode.

Please refer to FIG. 2. FIG. 2 is a diagram illustrating the self-refresh control circuit 104 generates a plurality of inner signals correspond to a self-refresh mode signal SRMS after the memory circuit enters the self-refresh mode. As shown in FIG. 2, when a tester enables the self-refresh mode signal SRMS, the memory circuit enters the self-refresh mode according to the self-refresh mode signal SRMS and the self-refresh control circuit 104 also generates a plurality of inner signals IS0, IS1, IS2, IS3, . . . , ISn, ISn+1 corresponding to an enabling period IT of the self-refresh mode signal SRMS according to the self-refresh mode signal SRMS, wherein n is a positive integer. As shown in FIG. 1, the self-refresh address counter 106 can count to generate an address count AC to the decoder 108 according to the plurality of inner signals IS0, IS1, IS2, IS3, . . . , ISn, ISn+1, wherein the address count AC is composed of a plurality bits. For example, the address count AC is composed of 8 bits B0-B7. But, the present invention is not limited to the address count AC being composed of the 8 bits B0-B7. Then, the decoder 108 can generate addresses of a plurality of word lines (e.g. addresses of word lines WL0, WL1, WL2, WL3, . . . , WLn, WLn+1) of the memory circuit corresponding to the plurality of inner signals IS0, IS1, IS2, IS3, . . . , ISn, ISn+1 according to the address count AC, wherein each inner signal of the plurality of inner signals IS0, IS, IS2, IS3, . . . , ISn, ISn+1 corresponds to each word line of the plurality of word lines WL0, WL1, WL2, WL3, . . . , WLn, WLn+1. Then, the memory circuit can execute data-refresh operation on memory cells coupled to the plurality of word lines WL0, WL1, WL2, WL3, . . . , WLn, WLn+1 in turn according to the plurality of inner signals IS0, IS, IS2, IS3, . . . , ISn, ISn+1. Therefore, after the memory circuit enters the self-refresh mode according to the self-refresh mode signal SRMS, the memory circuit executes the data-refresh operation on the memory cells coupled to the plurality of word lines WL0, WL1, WL2, WL3, . . . , WLn, WLn+1 in turn according to the plurality of inner signals IS0, IS, IS2, IS3, . . . , ISn, ISn+1. In addition, in one embodiment of the present invention, the plurality of word lines WL0, WL1, WL2, WL3, . . . , WLn, WLn+1 correspond to one bank of the memory circuit. But, in another embodiment of the present invention, the plurality of word lines WL0, WL1, WL2, WL3, . . . , WLn, WLn+1 correspond to a plurality of banks of the memory circuit, so meanwhile the memory circuit can execute the data-refresh operation on memory cells of the plurality of word lines WL0, WL1, WL2, WL3, . . . , WLn, WLn+1 corresponding to the plurality of banks of the memory circuit according to the inner signals IS0, IS1, IS2, IS3, . . . , ISn, ISn+1, respectively.

In addition, as shown in FIG. 2, the self-refresh control circuit 104 generates an inner signal ISn+2 when the self-refresh mode signal SRMS is disabled. But, because the inner signal ISn+2 is not completely included in the enabling period IT of the self-refresh mode signal SRMS, the memory circuit usually neglects the inner signal ISn+2. That is to say, if the memory circuit neglects the inner signal ISn+2, the self-refresh control circuit 104 will generate the inner signal ISn+2 again because the memory circuit finally executes the data-refresh operation on memory cells coupled to the word line WLn+1 of the memory circuit during the enabling period IT of the self-refresh mode signal SRMS after the self-refresh mode signal SRMS is enabled again at a time T1. Therefore, after the self-refresh mode signal SRMS is enabled again at the time T1, the memory circuit will start to execute the data-refresh operation from memory cells coupled to the word line WLn+2 of the memory circuit. In addition, as shown in FIG. 2, a time interval T (controlled by an oscillator within the memory circuit) exists between each two adjacent inner signals of plurality of inner signals IS0, IS, IS2, IS3, . . . , ISn, ISn+1, and the self-refresh control circuit 104 generates the inner signal IS0 after the self-refresh mode signal SRMS is enabled for a predetermined time interval PT, wherein the predetermined time interval PT can be equal to (or not equal to) the time interval T.

Figure 3:
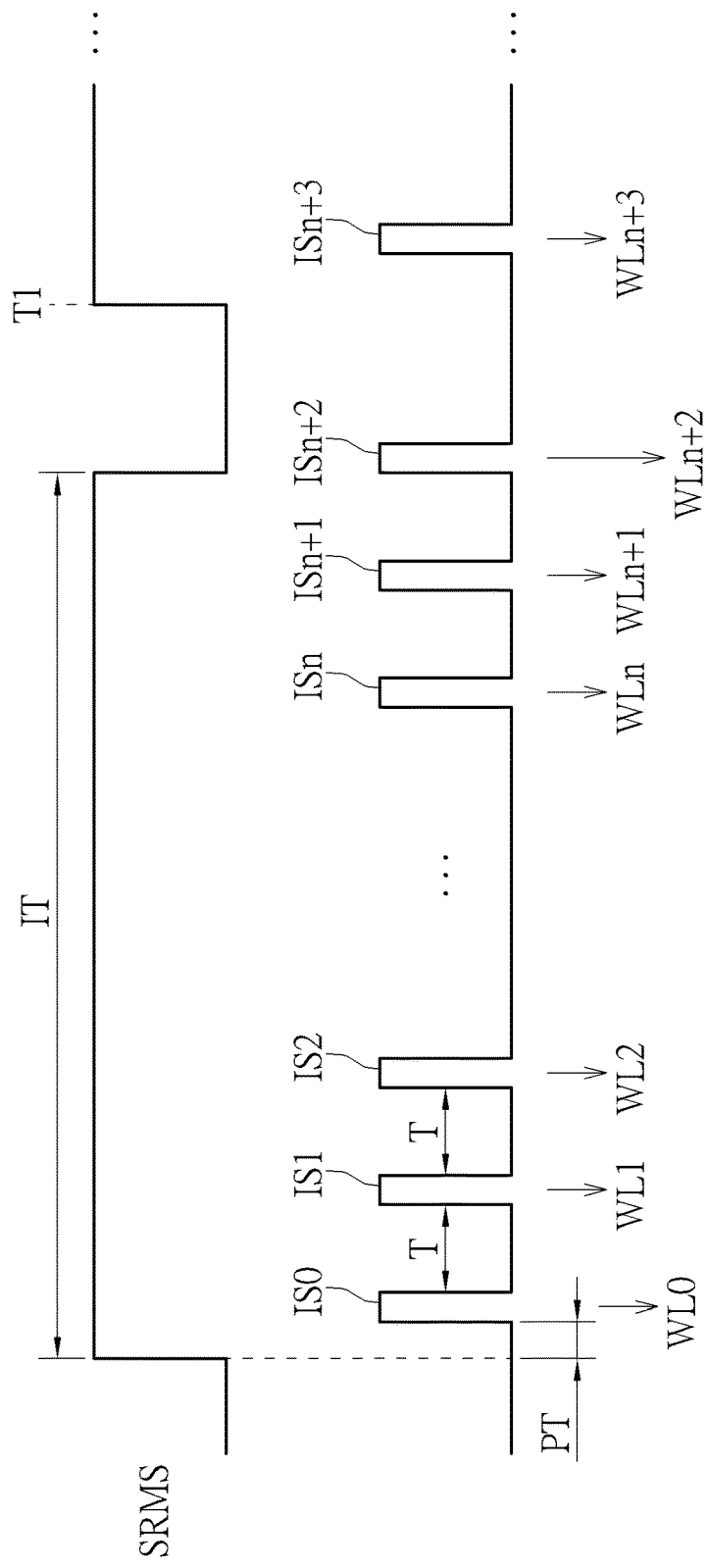

However, as shown in FIG. 3, if the memory circuit does not neglect the inner signal ISn+2, because the memory circuit finally executes the data-refresh operation on the memory cells coupled to the word line WLn+2 (corresponding to the inner signal ISn+2) of the memory circuit during the enabling period IT of the self-refresh mode signal SRMS, the self-refresh control circuit 104 will generate an inner signal ISn+3 followed the inner signal ISn+2 after the self-refresh mode signal SRMS is enabled again at the time T1. Therefore, after the self-refresh mode signal SRMS is enabled again at the time T1, the memory circuit will start to execute the data-refresh operation from memory cells coupled to a word line WLn+3 of the memory circuit.

Figure 4:
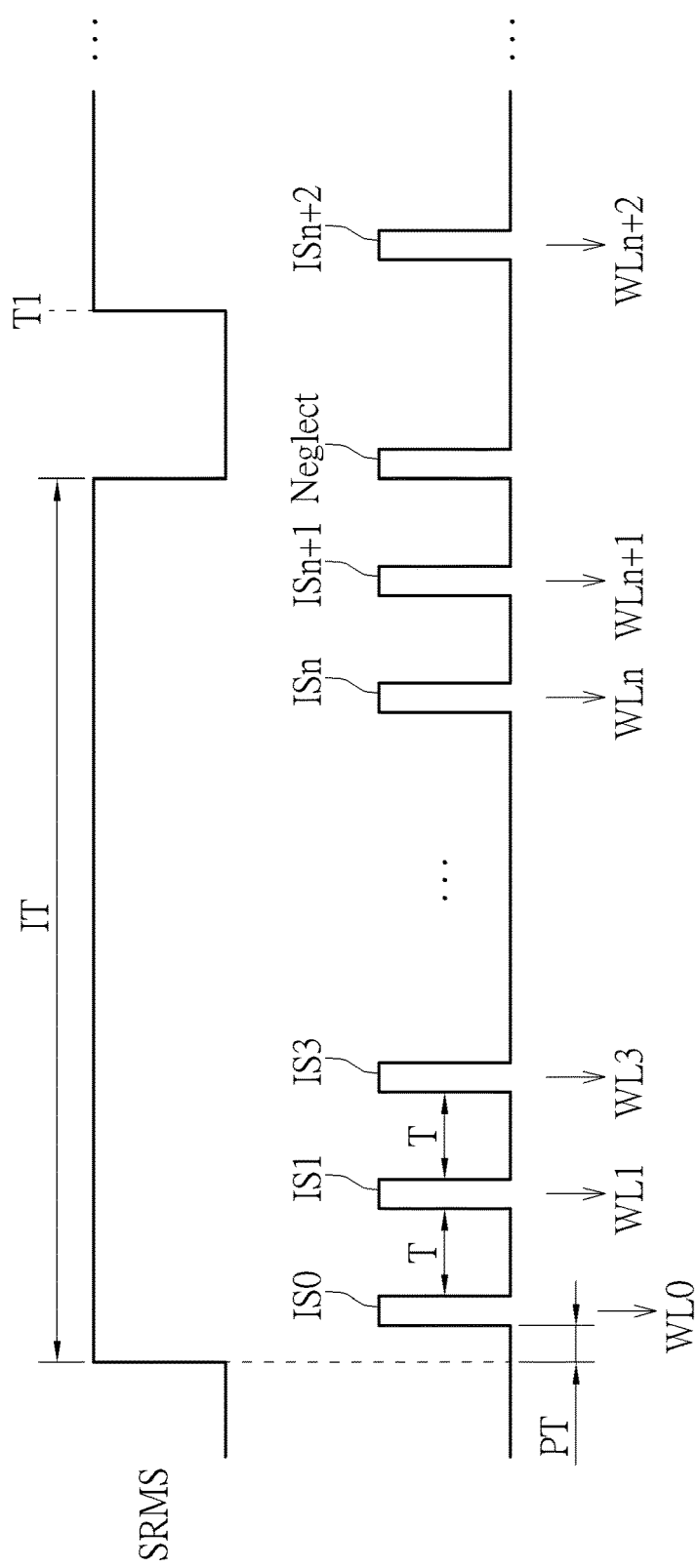
FIGS. 4-6 are diagrams illustrating the memory circuit having a self-refresh error after the memory circuit enters the self-refresh mode.
Figure 5:
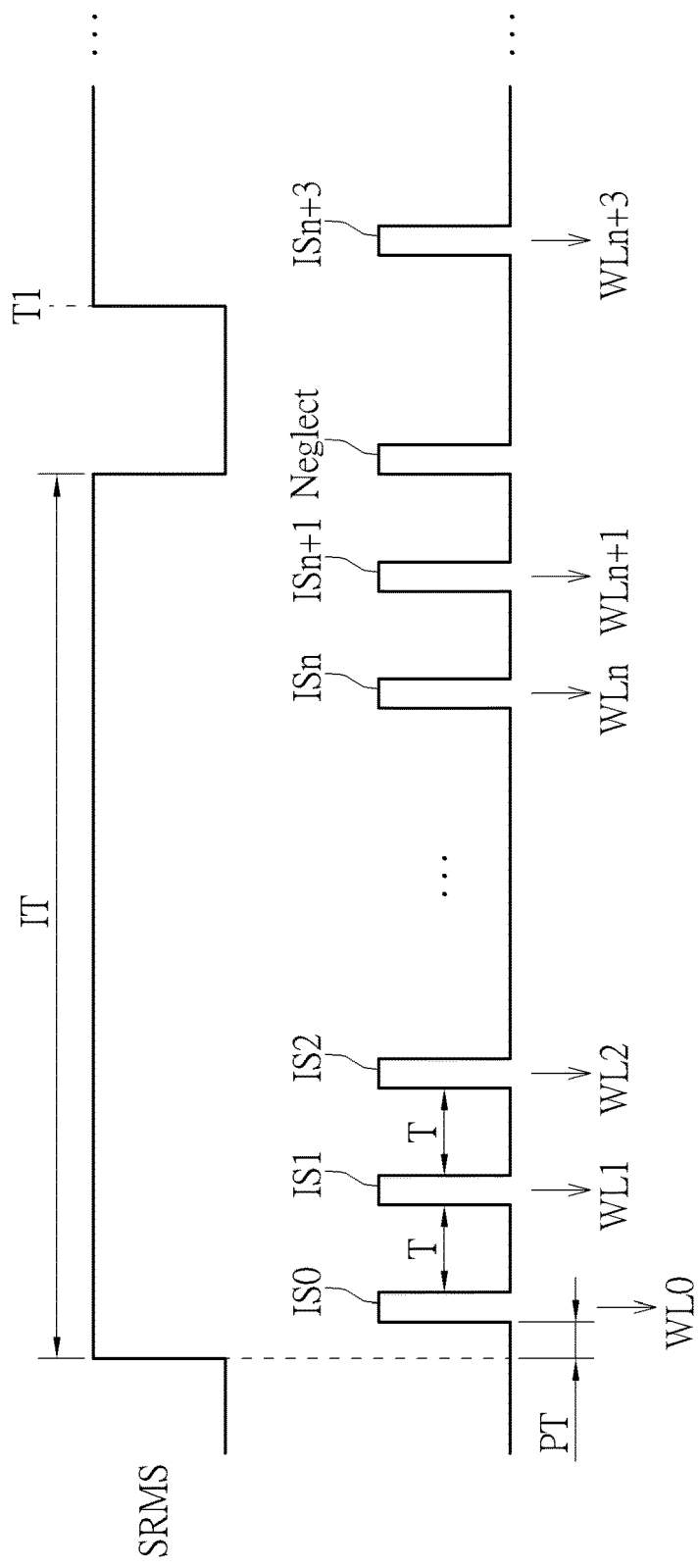
Figure 6:
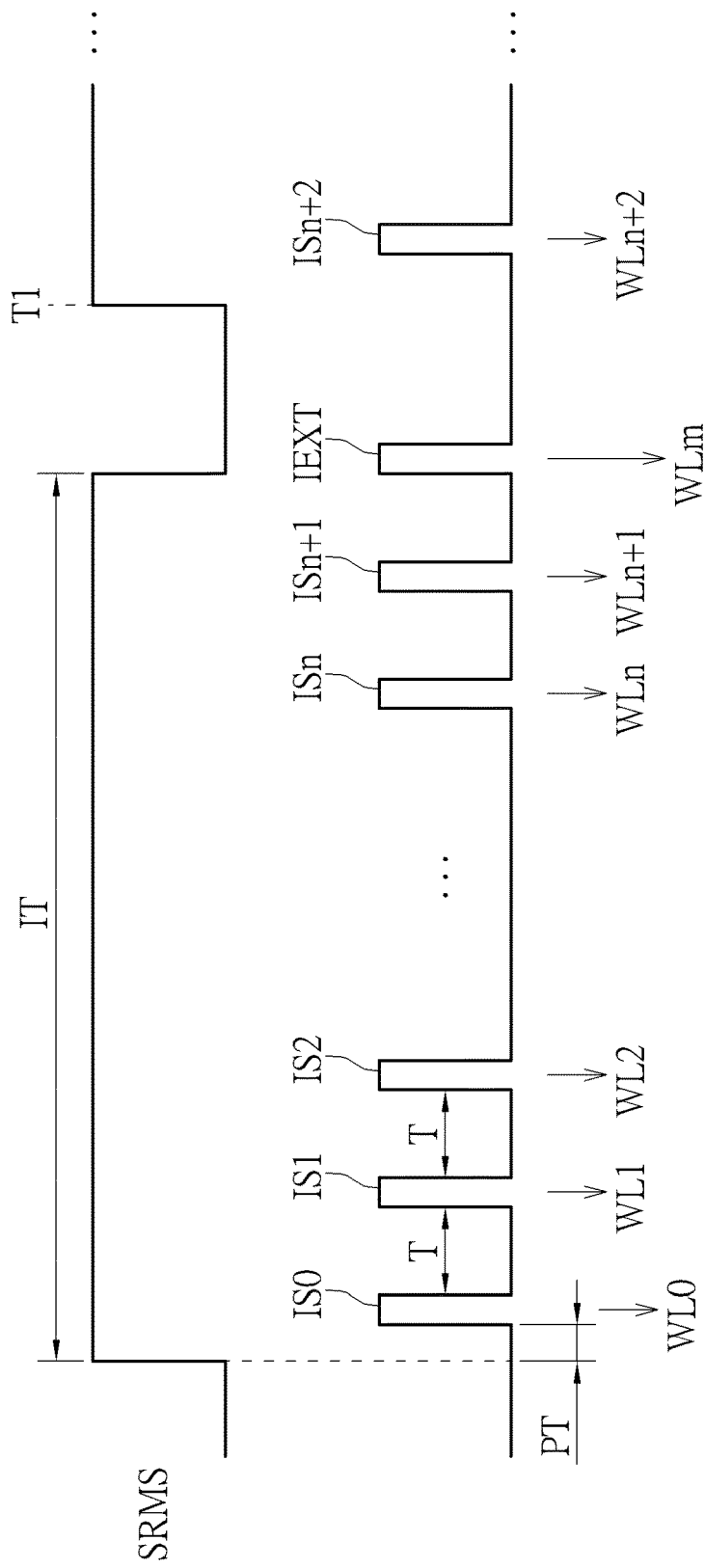

Please refer to FIGS. 4-6. FIGS. 4-6 are diagrams illustrating the memory circuit having a self-refresh error after the memory circuit enters the self-refresh mode. As shown in FIG. 4, after the memory circuit enters the self-refresh mode, the memory circuit executes the data-refresh operation on the memory cells coupled to the word lines WL0, WL1, WL2, WL3, . . . , WLn, WLn+1 corresponding to the inner signals IS0, IS1, IS2, IS3, . . . , ISn, ISn+1 in turn according to the inner signals IS0, IS1, IS2, IS3, . . . , ISn, ISn+1 during the enabling period IT of the self-refresh mode signal SRMS. Because after the memory circuit enters the self-refresh mode, the memory circuit should execute the data-refresh operation on the memory cells coupled to the word lines WL0, WL1, WL2, WL3, . . . , WLn, WLn+1 in turn, according to FIG. 4, it is obvious that after the memory circuit enters the self-refresh mode, the self-refresh control circuit 104 does not generate the inner signal IS2, resulting in the memory circuit failing to execute the data-refresh operation on memory cells of the word line WL2 of the memory circuit. That is, the memory circuit has the self-refresh error.

As shown in FIG. 5, after the memory circuit enters the self-refresh mode, the memory circuit executes the data-refresh operation on the memory cells coupled to the word lines WL0, WL1, WL2, WL3, . . . , WLn, WLn+1 corresponding to the inner signals IS0, IS1, IS2, IS3, . . . , ISn, ISn+1 in turn according to the inner signals IS0, IS1, IS2, IS3, . . . , ISn, ISn+1 during the enabling period IT of the self-refresh mode signal SRMS. Because the memory circuit finally executes the data-refresh operation on the memory cells coupled to the word line WLn+1 during the enabling period IT of the self-refresh mode signal SRMS, the self-refresh control circuit 104 should generate the inner signal ISn+2 to make the memory circuit start to execute the data-refresh operation from the memory cells coupled to the word line WLn+2 of the memory circuit after the self-refresh mode signal SRMS is enabled again at the time T1. However, according to FIG. 5, it is obvious that the self-refresh control circuit 104 generates the inner signal ISn+3 after the self-refresh mode signal SRMS is enabled again at the time T1, so the memory circuit starts to execute the data-refresh operation from the memory cells coupled to the word line WLn+3 of the memory circuit, rather than starting to execute the data-refresh operation from the memory cells coupled to the word line WLn+2 of the memory circuit, resulting in the memory circuit having the self-refresh error.

As shown in FIG. 6, after the memory circuit enters the self-refresh mode, the memory circuit executes the data-refresh operation on the memory cells coupled to the word lines WL0, WL1, WL2, WL3, . . . , WLn, WLn+1, Wm of the memory circuit corresponding to the inner signals IS0, IS1, IS2, IS3, . . . , ISn, ISn+1, and an external signal IEXT in turn according to the inner signals IS0, IS1, IS2, IS3, . . . , ISn, ISn+1, and the external signal IEXT during the enabling period IT of the self-refresh mode signal SRMS, wherein m is a positive integer, m is not equal to 0, 1, 2, 3, . . . , n, n+1, and the tester currently utilizes the external signal IEXT to execute a predetermined function on the memory cells coupled to the word line Wm of the memory circuit, wherein the predetermined function is not executing the data-refresh operation on the memory cells coupled to the word line Wm of the memory circuit. According to FIG. 6, it is obvious that the memory circuit further executes the data-refresh operation on the memory cells coupled to the word line Wm corresponding to the external signal IEXT according to the external signal IEXT between the inner signal ISn+2 and the inner signal ISn+3 generated by the self-refresh control circuit 104, but because the external signal IEXT is not used for executing the data-refresh operation on the memory cells coupled to the word line Wm, the memory circuit has the self-refresh error.

Figure 7:
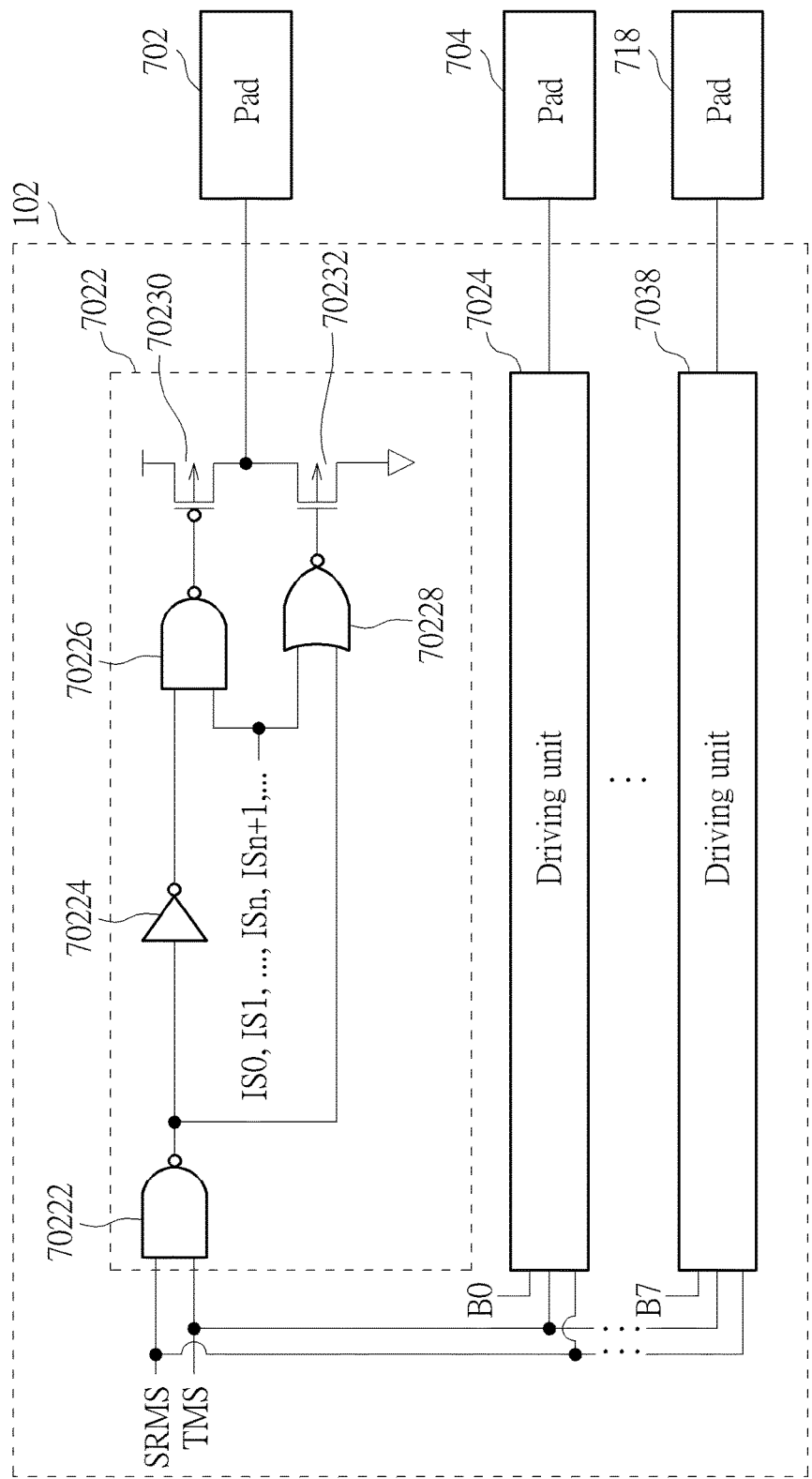
FIG. 7 is a diagram illustrating a driving unit of the driver.

Please refer to FIG. 7. FIG. 7 is a diagram illustrating a driving unit 7022 of the driver 102, wherein the driving unit 7022 includes a first NAND gate 70222, an inverter 70224, a second NAND gate 70226, a NOR gate 70228, a P-type metal-oxide-semiconductor transistor 70230, and an N-type metal-oxide-semiconductor transistor 70232, and coupling relationships between the first NAND gate 70222, the inverter 70224, the second NAND gate 70226, the NOR gate 70228, the P-type metal-oxide-semiconductor transistor 70230, and the N-type metal-oxide-semiconductor transistor 70232 can be referred to FIG. 7, so further description thereof is omitted for simplicity. In addition, the driving unit 7022 is coupled to a pad 702 of the memory circuit. As shown in FIG. 7, the driving unit 7022 (that is, an inner signal driving circuit) is used for driving the pad 702 (that is, an inner signal pad) to output information of the plurality of inner signals IS0, IS, IS2, IS3, . . . , ISn, ISn+1, . . . in turn when the tester enables the self-refresh mode signal SRMS and a test mode signal TMS (that is, the memory circuit enters the self-refresh mode). For example, when the self-refresh mode signal SRMS and the test mode signal TMS are enabled (that is, the self-refresh mode signal SRMS and the test mode signal TMS are high), if the self-refresh control circuit 104 generates the inner signal IS0 (wherein the inner signal IS0 is high), the P-type metal-oxide-semiconductor transistor 70230 is turned on and the N-type metal-oxide-semiconductor transistor 70232 is turned off, resulting in the pad 702 outputting the information corresponding to the inner signal IS0. In addition, if the self-refresh control circuit 104 fails to generate the inner signal IS0, the P-type metal-oxide-semiconductor transistor 70230 is turned off and the N-type metal-oxide-semiconductor transistor 70232 is turned on, resulting in the pad 702 failing to output the information corresponding to the inner signal IS0. In addition, because the address count AC is composed of the 8 bits B0-B7, the driver 102 utilizes 8 driving units 7024-7038 (that is, address information driving circuits) to output information of the address count AC, that is, the driving units 7024-7038 are used for outputting information of the 8 bits B0-B7 respectively, wherein a circuit structure of each driving unit of the driving units 7024-7038 is the same as that of the driving unit 7022, so further description thereof is omitted for simplicity. In addition, as shown in FIG. 7, the driving units 7024-7038 are coupled to pads 704-718 (that is, address information pads) of the memory circuit, respectively. Therefore, when the self-refresh mode signal SRMS and the test mode signal TMS are enabled, if the self-refresh control circuit 104 generates the inner signal IS0 (meanwhile, the address count AC is "0", "0", "0", "0", "0", "0", "0", "0"), outputs of the pads 704-718 are "0", "0", "0", "0", "0", "0", "0", "0" (information of an address of the word line WL0 corresponding to the inner signal IS0), respectively, wherein "0" represents low. That is to say, the tester can obtain the information of the inner signal IS0 and the information (that is, "0", "0", "0", "0", "0", "0", "0", "0") of the address of the word line WL0 corresponding to the inner signal IS0 according to the outputs of the pads 702-718. In addition, the tester can also obtain information of the inner signals IS1, IS2, IS3, . . . , ISn, ISn+1, . . . and information of addresses of the word lines WL1, WL2, WL3, . . . , WLn, WLn+1, . . . corresponding to the inner signals IS1, IS2, IS3, . . . , ISn, ISn+1, . . . according to the outputs of the pads 702-718. In addition, after the memory circuit leaves the self-refresh mode, the pads 702-718 are used for outputting or receiving other predetermining signals, rather than outputting the information of the inner signals IS0, IS1, IS2, IS3, . . . , ISn, ISn+1, . . . and the information of the addresses of the word lines WL0, WL1, WL2, WL3, . . . , WLn, WLn+1, . . . corresponding to the inner signals IS0, IS1, IS2, IS3, . . . , ISn, ISn+1, . . . . That is to say, after the memory circuit enters the self-refresh mode, if the pads 702-718 do not output the information of the inner signals IS0, IS1, IS2, IS3, . . . , ISn, ISn+1, . . . and the information of the addresses of the word lines WL0, WL1, WL2, WL3, . . . , WLn, WLn+1, . . . corresponding to the inner signals IS0, IS1, IS2, IS3, . . . , ISn, ISn+1, . . . , the pads 702-718 do also not output or receive the other predetermining signals.

Because the tester can obtain the information of the inner signals IS0, IS1, IS2, IS3, . . . , ISn, ISn+1, . . . and the information of the addresses of the word lines WL0, WL1, WL2, WL3, . . . , WLn, WLn+1, . . . according to the outputs of the pads 702-718, if the memory circuit malfunctions after the memory circuit leaves the self-refresh mode, the tester can know that the memory circuit malfunctions due to the self-refresh errors shown in FIGS. 4-6 or other reasons according to the information of the inner signals IS0, IS1, IS2, IS3, ..., ISn, ISn+1, ... and the information of the addresses of the word lines WL0, WL1, WL2, WL3, ..., WLn, WLn+1, .... Therefore, compared to the prior art, the tester can be easier to exclude malfunction of the memory circuit.

In addition, the present invention is not limited to a circuit structure of the driving unit 7022. That is to say, any circuit that can output the information of the inner signals IS0, IS1, IS2, IS3, ..., ISn, ISn+1, ... when the self-refresh mode signal SRMS and the test mode signal TMS are enabled (that is, the self-refresh mode signal SRMS and the test mode signal TMS are high) falls within the scope of the present invention. In addition, in another embodiment of the present invention, the circuit 100 includes a driver 102, the self-refresh control circuit 104, the self-refresh address counter 106, and the pads 702-718.

Figure 8:
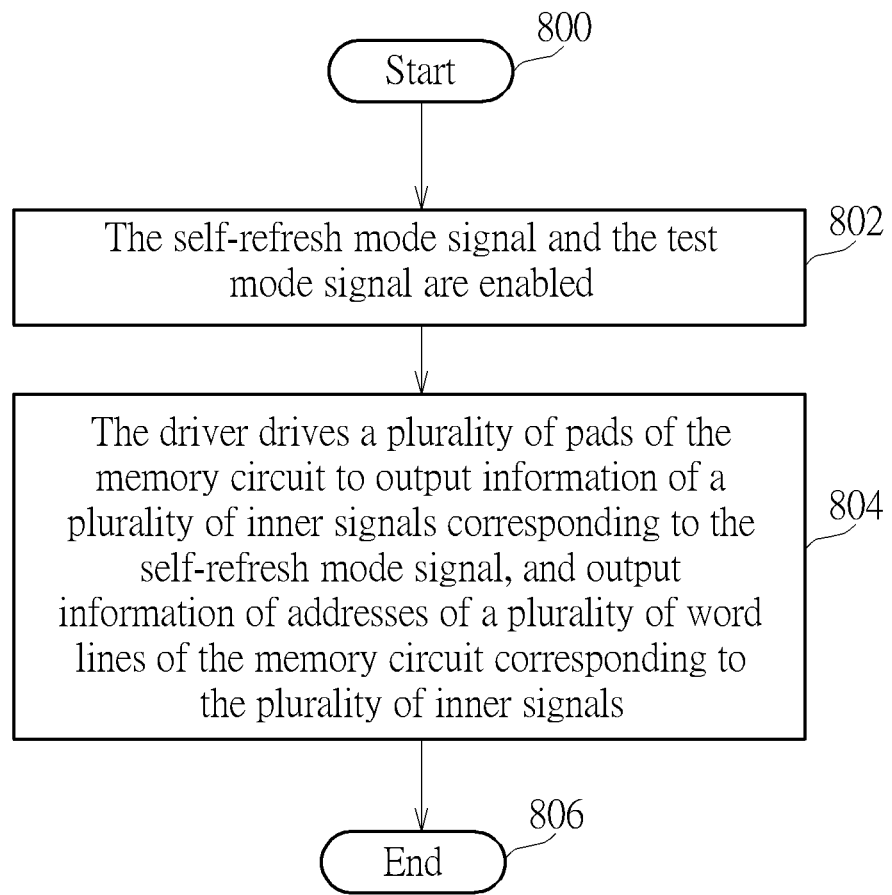
FIG. 8 is a flowchart illustrating a method for outputting information of a memory circuit during a self-refresh mode according to a second embodiment of the present invention.

Please refer to FIGS. 1, 4-8. FIG. 8 is a flowchart illustrating a method for outputting information of a memory circuit during a self-refresh mode according to a second embodiment of the present invention. The method in FIG. 8 is illustrated using the circuit 100 in FIG. 1. Detailed steps are as follows:

Step 800: Start.

Step 802: The self-refresh mode signal SRMS and the test mode signal TMS are enabled.

Step 804: The driver 102 drives a plurality of pads of the memory circuit to output information of a plurality of inner signals corresponding to the self-refresh mode signal SRMS, and output information of addresses of a plurality of word lines of the memory circuit corresponding to the plurality of inner signals.

Step 806: End.

In Step 804, as shown in FIG. 7, the driving unit 7022 is used for driving the pad 702 to output the information of the plurality of inner signals IS0, IS, IS2, IS3, ..., ISn, ISn+1, ... in turn when the tester enables the self-refresh mode signal SRMS and the test mode signal TMS (that is, the memory circuit enters the self-refresh mode). For example, when the self-refresh mode signal SRMS and the test mode signal TMS are enabled (that is, the self-refresh mode signal SRMS and the test mode signal TMS are high), if the self-refresh control circuit 104 generates the inner signal IS0 (wherein the inner signal IS0 is high), the P-type metal-oxide-semiconductor transistor 70230 is turned on and the N-type metal-oxide-semiconductor transistor 70232 is turned off, resulting in the pad 702 outputting the information corresponding to the inner signal IS0. In addition, if the self-refresh control circuit 104 fails to generate the inner signal IS0, the P-type metal-oxide-semiconductor transistor 70230 is turned off and the N-type metal-oxide-semiconductor transistor 70232 is turned on, resulting in the pad 702 failing to output the information corresponding to the inner signal IS0. In addition, because the address count AC is composed of the 8 bits B0-B7, the driver 102 utilizes the driving units 7024-7038 to output the information of the address count AC, that is, the driving units 7024-7038 are used for outputting the information of the 8 bits B0-B7 respectively, wherein the circuit structure of each driving unit of the driving units 7024-7038 is the same as that of the driving unit 7022, so further description thereof is omitted for simplicity. In addition, as shown in FIG. 7, the driving units 7024-7038 are coupled to the pads 704-718 of the memory circuit, respectively. Therefore, when the self-refresh mode signal SRMS and the test mode signal TMS are enabled, the tester can obtain the information of the inner signals IS0, IS1, IS2, IS3, ..., ISn, ISn+1, ... and the information of the addresses of the word lines WL0, WL1, WL2, WL3, ..., WLn, WLn+1, ... corresponding to the inner signals IS0, IS1, IS2, IS3, ..., ISn, ISn+1, ... according to the outputs of the pads 702-718.

Because the tester can obtain the information of the inner signals IS0, IS1, IS2, IS3, ..., ISn, ISn+1, ... and the information of the addresses of the word lines WL0, WL1, WL2, WL3, ..., WLn, WLn+1, ... according to the outputs of the pads 702-718, if the memory circuit malfunctions after the memory circuit leaves the self-refresh mode, the tester can know that the memory circuit malfunctions due to the self-refresh errors shown in FIGS. 4-6 or other reasons according to the information of the inner signals IS0, IS1, IS2, IS3, ..., ISn, ISn+1, ... and the information of the addresses of the word lines WL0, WL1, WL2, WL3, ..., WLn, WLn+1, .... Therefore, compared to the prior art, the tester can be easier to exclude malfunction of the memory circuit.

To sum up, the circuit for outputting the information of the memory circuit during the self-refresh mode and the related method thereof utilize the driver to drive the plurality of pads of the memory circuit to output the information of the plurality of inner signals corresponding to the self-refresh mode signal, and output the information of the addresses of the plurality of word lines of the memory circuit corresponding to the plurality of inner signals after the tester enables the self-refresh mode signal and the test mode signal, wherein the plurality of pads do not output or receive the other predetermining signals after the memory circuit enters the self-refresh mode. Because the tester can obtain the information of the plurality of inner signals and the information of the addresses of the plurality of word lines corresponding to the plurality of inner signals according to the outputs of the plurality of pads, if the memory circuit malfunctions after the memory circuit leaves the self-refresh mode, the tester can know that the memory circuit malfunctions due to the self-refresh errors of the memory circuit or other reasons. Therefore, compared to the prior art, the tester can be easier to exclude the malfunction of the memory circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit for outputting information of a memory circuit during a self-refresh mode, comprising:
   a driver coupled to a self-refresh control circuit and a self-refresh address counter of the memory circuit for driving a plurality of pads of the memory circuit to output information of a plurality of inner signals corresponding to a self-refresh mode signal, and output information of addresses of a plurality of word lines of the memory circuit when the self-refresh mode signal and a test mode signal are enabled and the memory circuit enters the self-refresh mode, wherein each word line of the plurality of word lines corresponds to an inner signal of the plurality of inner signals.

2. The circuit of claim 1, wherein the plurality of pads are used for outputting or receiving other predetermining signals after the memory circuit leaves the self-refresh mode.

3. The circuit of claim 1, wherein the plurality of word lines correspond to one bank of the memory circuit, or correspond to a plurality of banks of the memory circuit.

4. The circuit of claim 1, wherein after the memory circuit enters the self-refresh mode, the memory circuit executes data-refresh operation on memory cells coupled to the plurality of word lines in turn according to the plurality of inner signals.

5. The circuit of claim 1, wherein the self-refresh control circuit generates the plurality of inner signals according to the self-refresh mode signal.

6. The circuit of claim 1, wherein the self-refresh address counter counts to generate an address count according to an inner signal of the plurality of inner signals, and the driver outputs the address count, wherein the address count corresponds to an address of a word line of the plurality of word lines.

7. A method for outputting information of a memory circuit during a self-refresh mode, wherein a circuit applied to the method comprises a driver, the method comprising:
enabling a self-refresh mode signal and a test mode signal; and
the driver driving a plurality of pads of the memory circuit to output information of a plurality of inner signals corresponding to the self-refresh mode signal, and output information of addresses of a plurality of word lines of the memory circuit when the self-refresh mode signal and the test mode signal are enabled and the memory circuit enters the self-refresh mode, wherein each word line of the plurality of word lines corresponds to an inner signal of the plurality of inner signals.

8. The method of claim 7, wherein, the plurality of pads are used for outputting or receiving other predetermining signals after the memory circuit leaves the self-refresh mode.

9. The method of claim 7, wherein the plurality of word lines correspond to one bank of the memory circuit, or correspond to a plurality of banks of the memory circuit.

10. The method of claim 7, wherein after the memory circuit enters the self-refresh mode, the memory circuit executes data-refresh operation on memory cells coupled to the plurality of word lines in turn according to the plurality of inner signals.

11. The method of claim 7, wherein the plurality of inner signals are generated by a self-refresh control circuit of the memory circuit according to the self-refresh mode signal.

12. The method of claim 7, wherein a self-refresh address counter of the memory circuit counts to generate an address count according to an inner signal of the plurality of inner signals, and the driver outputs the address count, wherein the address count corresponds to an address of a word line of the plurality of word lines.

13. A memory circuit capable of outputting information thereof during a self-refresh mode, the memory circuit comprising:
a self-refresh control circuit generating a plurality of inner signals corresponding to a self-refresh mode signal according to the self-refresh mode signal;
a self-refresh address counter generating an address count according to an inner signal of the plurality of inner signals;
an inner signal pad;
at least one address information pad; and
a driver coupled to the self-refresh control circuit, the self-refresh address counter, the inner signal pad, and the at least one address information pad, the driver comprising:
an inner signal driving circuit coupled to the inner signal pad; and
at least one address information driving circuit coupled to the at least one address information pad;
wherein the inner signal driving circuit outputs the inner signal to the inner signal pad, and the at least one address information driving circuit outputs the address count to the at least one address information pad.

14. The memory circuit of claim 13, wherein the plurality of inner signals correspond to a plurality of word lines of the memory circuit.

15. The memory circuit of claim 14, wherein the address count corresponds to an address of a word line of the plurality of word lines.

* * * * *